US012336154B2

(12) United States Patent
Shigeta (10) Patent No.: US 12,336,154 B2
(45) Date of Patent: Jun. 17, 2025

(54) UNINTERRUPTIBLE POWER SUPPLY SYSTEM

(71) Applicant: TOSHIBA MITSUBISHI-ELECTRIC INDUSTRIAL SYSTEMS CORPORATION, Chuo-ku (JP)

(72) Inventor: Hiroki Shigeta, Chuo-ku (JP)

(73) Assignee: TMEIC CORPORATION, Chuo-ku (JP)

( * ) Notice: Subject to any disclaimer, the term of this patent is extended or adjusted under 35 U.S.C. 154(b) by 0 days.

(21) Appl. No.: 18/260,633

(22) PCT Filed: Nov. 22, 2021

(86) PCT No.: PCT/JP2021/042792
§ 371 (c)(1),
(2) Date: Jul. 7, 2023

(87) PCT Pub. No.: WO2023/089827
PCT Pub. Date: May 25, 2023

(65) Prior Publication Data
US 2024/0064942 A1 Feb. 22, 2024

(51) Int. Cl.
*H05K 7/20* (2006.01)
*H02J 9/06* (2006.01)

(52) U.S. Cl.
CPC .......... *H05K 7/20909* (2013.01); *H02J 9/062* (2013.01)

(58) Field of Classification Search
CPC ................................................... H05K 7/209
See application file for complete search history.

(56) References Cited

U.S. PATENT DOCUMENTS

| 2014/0273792 | A1 | 9/2014 | Kondo |
| 2019/0165552 | A1* | 5/2019 | Kin ...................... H05K 7/1432 |
| 2019/0230825 | A1* | 7/2019 | Kurozaki .............. H02M 7/003 |

FOREIGN PATENT DOCUMENTS

| JP | 2004-364372 A | 12/2004 |
| JP | 2014-40970 A | 3/2014 |
| JP | 2014-181832 A | 9/2014 |
| JP | 2018207630 A | * 12/2018 | ............... H05K 7/20 |
| JP | 2020-77818 A | 5/2020 |
| JP | 2020077818 A | * 5/2020 | ............. H01L 23/46 |

OTHER PUBLICATIONS

International Search Report issued Jan. 11, 2022 in PCT/JP2021/042792, filed on Nov. 22, 2021, 2 pages.
Japanese Office Action issued Aug. 8, 2023 in Japanese Patent Application No. 2022-529918 (with English Translation), 8 pages.
Written Opinion of the International Searching Authority issued Jan. 11, 2022 in PCT/JP2021/042792 (with English Translation), 8 pages.
Japanese Office Action issued Feb. 28, 2023 in Japanese Patent Application No. 2022-529918 (with English Translation), 7 pages.

* cited by examiner

*Primary Examiner* — Mukundbhai G Patel
(74) *Attorney, Agent, or Firm* — Oblon, McClelland, Maier & Neustadt, L.L.P.

(57) ABSTRACT

An uninterruptible power supply system includes: a group of electrical components that constitute the uninterruptible power supply system and are disposed in a first block of the housing; the other group of electrical components that constitute the uninterruptible power supply system and are disposed in a second block of the housing; and a partition structure disposed adjacent to an exhaust side of the second block to adjust an air flow flowing through the first block and the second block.

8 Claims, 12 Drawing Sheets

| INSTALLATION SPECIFICATIONS | 3-PHASE AC LINE VOLTAGE | RATED CAPACITY | INPUT RATED CURRENT (Ii) | OUTPUT RATED CURRENT (Io) | DC RATED CURRENT (Id) |
|---|---|---|---|---|---|
| FIRST INSTALLATION SPECIFICATION | 480V | 400kVA | 501Arms | 481Arms | 1041A |
| SECOND INSTALLATION SPECIFICATION | 400V | 333kVA | 501Arms | 481Arms | 867A |
| THIRD INSTALLATION SPECIFICATION | 400V | 350kVA | 526Arms | 505Arms | 911A |

UNINTERRUPTIBLE POWER SUPPLY SYSTEM

TECHNICAL FIELD

The present disclosure relates to an uninterruptible power supply system.

BACKGROUND ART

An uninterruptible power supply system includes electrical components such as a converter that converts electric power from AC power to DC power, an inverter that converts electric power from DC power to AC power, a chopper that boosts up/steps down a voltage between a DC current section and a storage battery, reactors and smoothing electrolytic capacitors connected to respective circuits, and input/output blocking contactors.

The plurality of electrical components of the uninterruptible power supply system are housed in a single housing. If a cooling fan is provided for each of the plurality of electrical components housed in the housing, the size of the housing may become greater. Thus, it is common that in an uninterruptible power supply system, a single cooling fan is provided to cool the plurality of electrical components housed in the housing.

For example, in a cooling device of a power converter described in PTL 1, a partition plate is disposed to partition a plurality of power converters and a control circuit thereof. In the cooling device, almost half of the plurality of power converters are disposed on the suction side of a power-converter cooling fan, the remaining power converters are disposed on the exhaust side of the cooling fan, and instead of installing a control-circuit cooling fan, the partition plate is provided with an air introduction port for guiding a part of cooling air supplied by the power-converter cooling fan to the control circuit.

CITATION LIST

Patent Literature

PTL 1: Japanese Patent Laying-Open No. 2004-36472- 2004-364372

SUMMARY OF INVENTION

Technical Problem

Uninterruptible power supply systems are often commercialized in series according to installation specifications, but the required voltage and frequency differ for each region where they are used. Productivity is poor if component specifications and component arrangement are changed for each market. On the other hand, if an uninterruptible power supply system is used under different installation specifications without changing component specifications and component arrangement, the amount of heat generated will vary due to the change of the current flowing through the uninterruptible power supply system. Therefore, it is difficult for the device described in PTL 1 to achieve the same cooling performance in multiple installation specifications.

It is therefore an object of the present disclosure to provide an uninterruptible power supply system that can be used in multiple installation specifications while maintaining equivalent cooling performance without changing component specifications and component arrangement.

Solution to Problem

An uninterruptible power supply system according to an embodiment of the present disclosure includes: a housing that houses components of the uninterruptible power supply system; a cooling fan that cools the interior of the housing; a group of electrical components that constitute the uninterruptible power supply system and are disposed in a first block of the housing; the other group of electrical components that constitute the uninterruptible power supply system and are disposed in a second block of the housing; and a partition structure that is disposed adjacent to an exhaust side of the second block to adjust an air flow flowing through the first block and the second block. The group of electrical components include an electrical component through which an AC current flows, and the other group of electrical components include an electrical component through which a DC current flows.

Advantageous Effects of Invention

Therefore, it is possible to use the uninterruptible power supply system of the present disclosure in multiple installation specifications while maintaining equivalent cooling performance without changing the component specifications and the component arrangement.

DESCRIPTION OF EMBODIMENTS

Embodiments of the present invention will now be described with reference to the drawings.

First Embodiment

Figure 1:
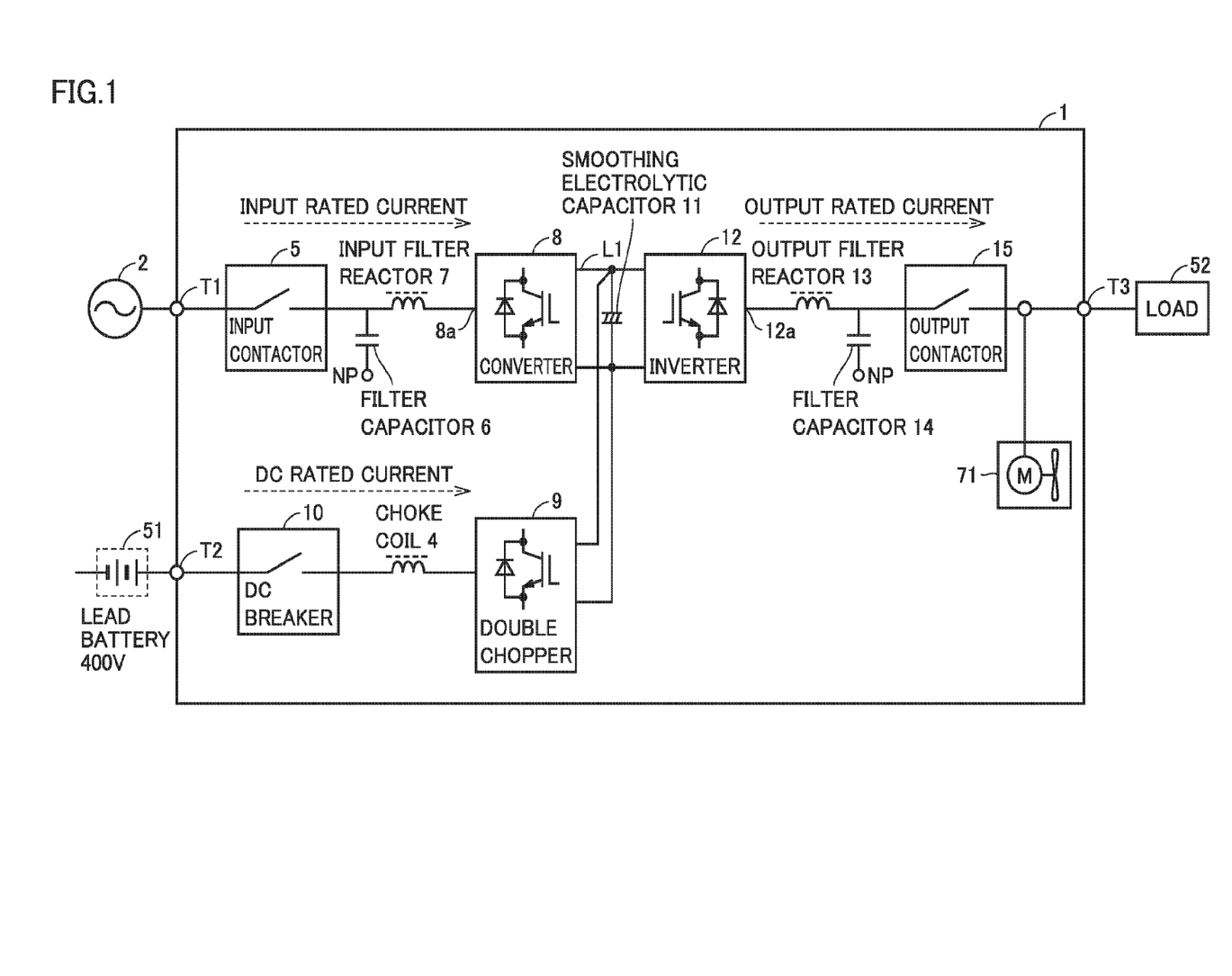
FIG. 1 is a diagram illustrating an uninterruptible power supply system according to a first embodiment.

FIG. 1 is a diagram illustrating an uninterruptible power supply system 1 according to a first embodiment. The uninterruptible power supply system 1 converts three-phase AC power supplied from a commercial AC power supply 2 into DC power, converts the DC power into three-phase AC power, and supplies the three-phase AC power to a load 52. For the purpose of simplifying the drawings and description, FIG. 1 only illustrates a partial circuit that corresponds to one phase (for example, U phase) among three phases (U phase, V phase, and W phase).

As illustrated in FIG. 1, the uninterruptible power supply system 1 includes an AC input terminal T1, a battery terminal T2, and an AC output terminal T3.

The AC input terminal T1 receives AC power of commercial frequency from the commercial AC power source 2. The battery terminal T2 is connected to a battery (power storage device) 51. The battery 51 stores DC power. A capacitor may be connected instead of the battery 51.

The AC output terminal T3 is connected to the load 52. The load 52 is driven by AC power.

The uninterruptible power supply system 1 further includes an input contactor 5, a filter capacitor 6, an input filter reactor 7, a converter 8, a DC breaker 10, a double chopper 9, a smoothing electrolytic capacitor 11, an inverter 12, a filter capacitor 14, an output filter reactor 13, an output contactor 15, and a cooling fan 71.

A first terminal of the input contactor 5 is connected to the AC input terminal T1. A second terminal of the input contactor 5 is connected to a first terminal of the input filter reactor 7 and a first terminal of the filter capacitor 6. A second terminal of the input filter reactor 7 is connected to an AC terminal 8a of the converter 8. A second terminal of the filter capacitor 6 is connected to a neutral point NP. The neutral point NP receives, for example, a ground voltage. The input contactor 5 is turned on when the uninterruptible power supply system 1 is in service, and is turned off during the maintenance of the uninterruptible power supply system 1, for example.

When AC power is normally supplied from the commercial AC power supply 2 (i.e., when the commercial AC power supply 2 is in service), the converter 8 converts the AC power into DC power and outputs the DC power to a DC line L1. When AC power is not normally supplied from the commercial AC power supply 2 (i.e., when the commercial AC power supply 2 is out of service), the converter 8 stops operation.

The battery 51 stores DC power. A capacitor may be connected instead of the battery 51.

The smoothing electrolytic capacitor 11 is connected to the DC line L1 to smooth the voltage of the DC line L1. The DC line L1 is connected to the high voltage side node of the double chopper 9, and the low voltage side node of the double chopper 9 is connected to the first terminal of the choke coil 4.

The second terminal of the choke coil 4 is connected to the battery terminal T2 via the DC breaker 10.

The DC breaker 10 is turned on when the uninterruptible power supply system 1 is in service, and is turned off during the maintenance of the uninterruptible power supply system 1 and the battery 51, for example.

The double chopper 9 stores the DC power generated by the converter 8 in the battery 51 when the commercial AC power supply 2 is in service, and supplies the DC power from the battery 51 to the inverter 12 via the DC line L1 when the commercial AC power supply 2 is out of service.

When storing DC power in the battery 51, the double chopper 9 steps down a DC voltage VDC of the DC line L1 and supplies it to the battery 51. When supplying the DC power from the battery 51 to the inverter 12, the double chopper 9 boosts a voltage VB between terminals of the battery 51 and outputs the boosted voltage to the DC line L1. The DC line L1 is connected to the input node of the inverter 12.

The inverter 12 converts the DC power supplied from the converter 8 or the double chopper 9 via the DC line L1 into AC power of commercial frequency and outputs the AC power. In other words, the inverter 12 converts the DC power supplied from the converter 8 via the DC line L1 into AC power when the commercial AC power supply 2 is in service, and converts the DC power supplied from the battery 51 via the double chopper 9 into AC power when the commercial AC power supply 2 is out of service. The output voltage of the inverter 12 can be controlled to a desired value.

An AC terminal 12a of the inverter 12 is connected to a first terminal of the output filter reactor 13 and a first terminal of the filter capacitor 14. A second terminal of the output filter reactor 13 is connected to a first terminal of the output contactor 15. A second terminal of the output contactor 15 is connected to the AC output terminal T3 and the cooling fan 71. A second terminal of the filter capacitor 14 is connected to the neutral point NP. The neutral point NP receives, for example, a ground voltage.

Figure 2:
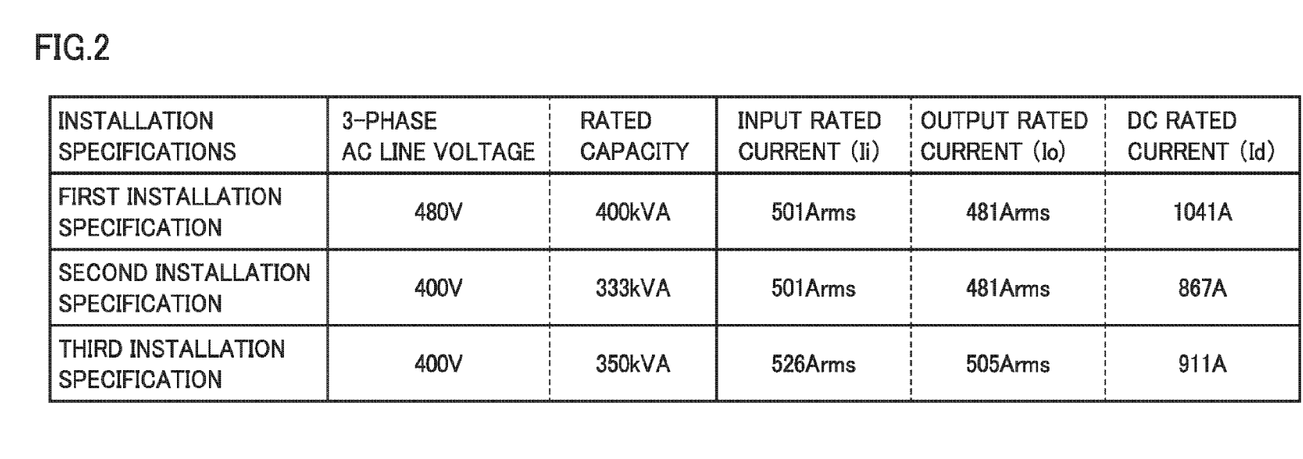
FIG. 2 is a diagram illustrating a first installation specification, a second installation specification and a third installation specification.

The uninterruptible power supply system of the present embodiment can operate in multiple installation specifications. FIG. 2 is a diagram illustrating a first installation specification, a second installation specification and a third installation specification.

An input rated current Ii is an AC current flowing through the input contactor 5, the input filter capacitor 6, the input filter reactor 7, and the converter 8. An output rated current Io is an AC current flowing through the inverter 12, the output filter reactor 13, the output filter capacitor 14, and the output contactor 15. A DC rated current Id is a DC current flowing through the DC breaker 10, the choke coil 4, and the double chopper 9.

In the first installation specification, the three-phase AC line voltage is 480 V, and the rated capacity is 400 kVA. When the conversion efficiency is 96% and the voltage of the battery 51 is 400 V, the input rated current Ii, the output rated current Io, and the DC rated current Id are calculated by the following equations, respectively.

$$Ii=(400,000/480)\div\sqrt{3}\div0.96=501 \text{ [Arms]} \quad (1)$$

$$Io=(400,000/480)\div\sqrt{3}=481 \text{ [Arms]} \quad (2)$$

$$Id=(400,000/400)\div0.96=1041 \text{ [A]} \quad (3)$$

In the second installation specification, the three-phase AC line voltage is 400 V, and the rated capacity is 333 kVA. When the conversion efficiency is 96% and the voltage of the battery 51 is 400 V, the input rated current Ii, the output rated current Io, and the DC rated current Id are calculated by the following equations, respectively.

$$Ii=(333,000/400)\div\sqrt{3}\div0.96=501 \text{ [Arms]} \quad (4)$$

$$Io=(333,000/400)\div\sqrt{3}=481 \text{ [Arms]} \quad (5)$$

$$Id=(333,000/400)\div0.96=867 \text{ [A]} \quad (6)$$

In the third installation specification, the three-phase AC line voltage is 400 V, and the rated capacity is 350 kVA. When the conversion efficiency is 96% and the voltage of the battery 51 is 400 V, the input rated current Ii, the output rated current Io, and the DC rated current Id are calculated by the following equations, respectively.

$$Ii=(350,000/400)\div\sqrt{3}\div0.96=526 \text{ [Arms]} \quad (7)$$

$$Io=(350,000/400)\div\sqrt{3}=505 \text{ [Arms]} \quad (8)$$

$$Id=(350,000/400)\div0.96=911 \text{ [A]} \quad (9)$$

In the first installation specification and the second installation specification, the input rated current Ii is equal to the output rated current Io. The DC rated current Id in the second installation specification is smaller than the DC rated current Id in the first installation specification. Therefore, the amount of heat generated by the components (the DC breaker 10, the choke coil 4, and the double chopper 9) through which the DC current flows in the second installation specification is smaller than that in the first installation specification. Therefore, if components that can withstand the current flowing in the first installation specification are selected as components constituting the uninterruptible power supply system 1, the uninterruptible power supply system 1 constituted by these components can be used in both the first installation specification and the second installation specification.

In the third installation specification, the DC rated current Id decreases but the input rated current Ii and the output rated current Io increase as compared with those in the first installation specification.

Conventionally, as the AC current increases, it is required to change semiconductor switches used in the reactors 7 and 13, the contactors 5 and 15, the inverter 12, the converter 8, and the like to those having a larger rating. In the present embodiment, by controlling the air flow, it is possible for the components selected to operate in the first installation specification to operate in the second installation specification or the third installation specification without changing the specifications and arrangement thereof.

In the present embodiment, in order to operate the uninterruptible power supply system 1 in the third installation specification, the amount of air flowing to the components through which the DC current flows is reduced, and the reduced amount of air is introduced to the components through which the AC current flows as compared with the case to operate the uninterruptible power supply system 1 in the first and second installation specifications.

Figure 3:
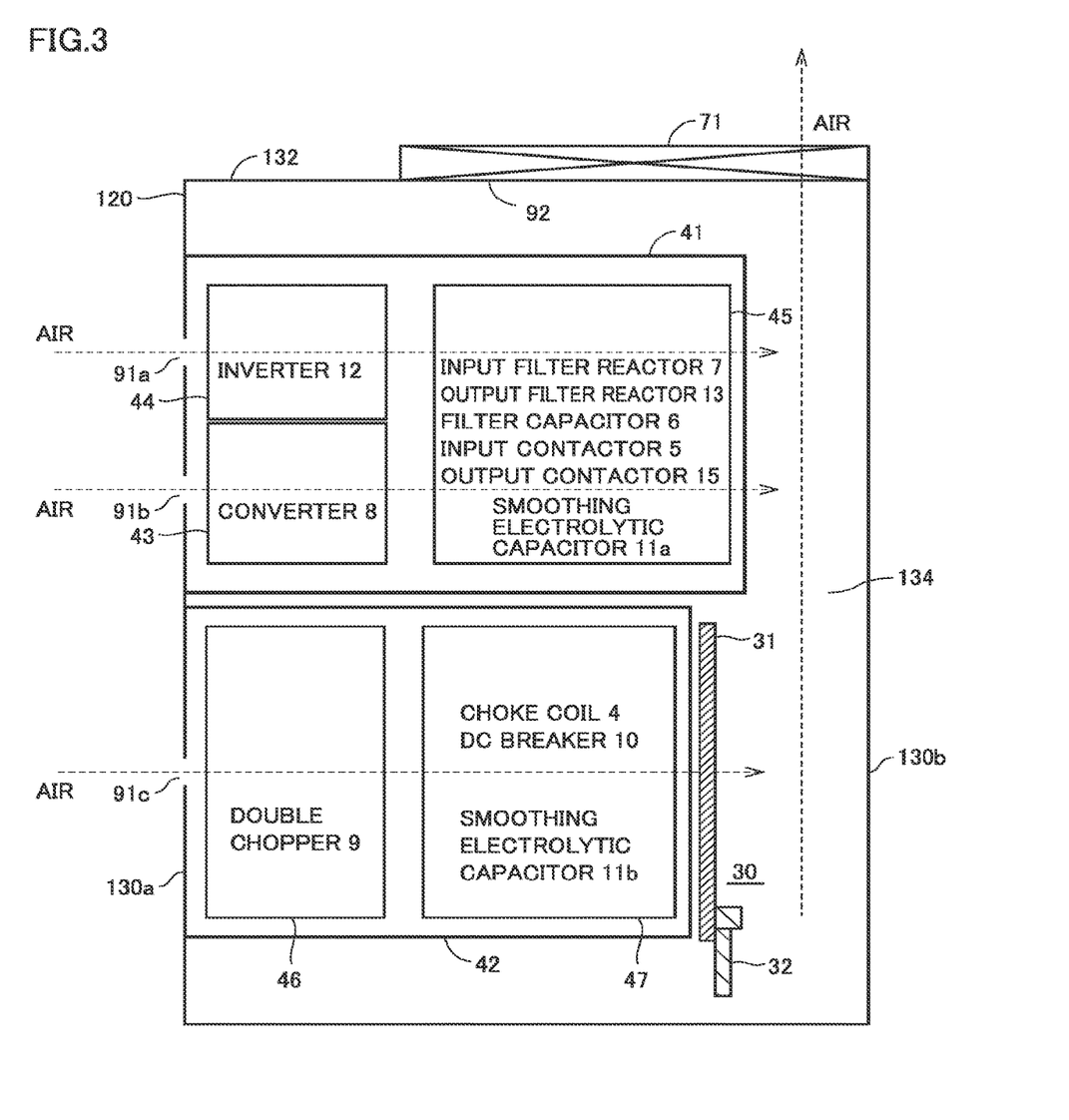
FIG. 3 is a cross-sectional view illustrating components arranged in a housing when the installation specification is a first installation specification or a second installation specification according to the first embodiment.

FIG. 3 is a cross-sectional view illustrating components arranged in a housing when the installation specification is the first installation specification or the second installation specification according to the first embodiment.

In the first installation specification and the second installation specification, the size of the housing 120, the arrangement of the second block 42 and the arrangement of the first blocks 41 in the housing are determined so that the uninterruptible power supply system 1 can be sufficiently cooled.

A group of electrical components constituting the uninterruptible power supply system 1 are disposed in the first block 41. The group of electrical components include an electrical component through which an AC current flows. For example, as illustrated in FIG. 3, the inverter 12, the converter 8, the input filter reactor 7, the output filter reactor 13, the filter capacitor 6, and the input contactor 5 may be disposed in the first block 41.

The other group of electrical components constituting the uninterruptible power supply system 1 are disposed in the second block 42. The other group of electrical components include an electrical component through which a DC current flows. For example, as illustrated in FIG. 3, the double chopper 9, the choke coil 4, and the DC breaker 10 may be disposed in the second block 42.

The smoothing electrolytic capacitor 11 is disposed in the first block 41 and in the second block 42. This is because the smoothing electrolytic capacitor 11 needs to be disposed in the vicinity of each of the inverter 12, the converter 8, and the double chopper 9 so as to suppress the inductance between an IGBT element and the capacitor.

Air inlets 91a, 91b, and 91c are disposed on a first side surface 130a of the rectangular parallelepiped housing 120. The cooling fan 71 and an air outlet 92 are disposed on an upper surface 132 of the housing. The first block 41 is disposed adjacent to the first side surface 130a at a higher position, and the second block 42 is disposed adjacent to the first side surface 130a at a lower position.

A space 134 is formed between the second side surface 130b opposed to the first side surface 130a of the housing 120 and the first block 41 and the second block 42.

The partition structure 30 is disposed opposite to the second side surface 130b and adjacent to the exhaust side of the second block 42. The partition structure 30 is configured to adjust an air flow flowing through the first block 41 and the second block 42.

The partition structure 30 is configured to increase the air flow flowing through the first block 41 and decrease the air flow flowing through the second block 42 in an installation specification (for example, the third installation specification) in which the magnitude of each of the AC currents Ii and Io is larger than a first magnitude and the magnitude of the DC current Id is smaller than a second magnitude as compared with an installation specification (for example, the first installation specification) in which the magnitude of each of the AC currents Ii and Io is equal to the first magnitude and the magnitude of the DC current Id is equal to the second magnitude.

The partition structure 30 includes a partition plate 31 and an air volume adjustment plate 32. The air volume adjustment plate 32 is configured to be movable in the vertical direction so as to cover all or a part of an opening provided on the partition plate 31.

Figure 4:
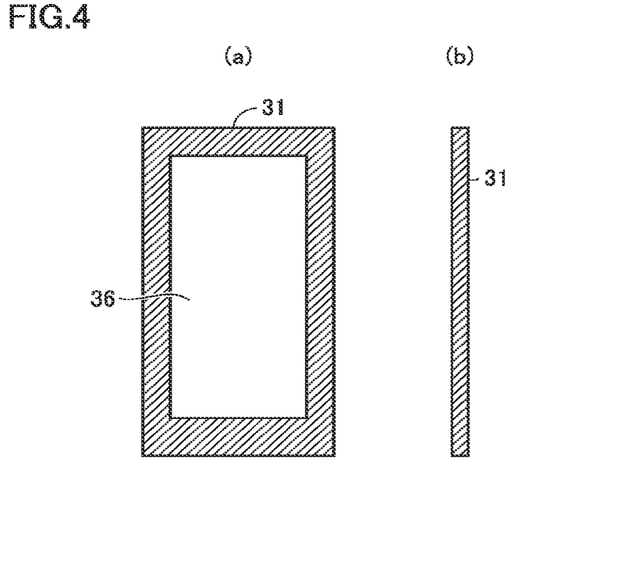
FIG. 4(a) is a front view illustrating a partition plate 31.
FIG. 4(b) is a side view illustrating the partition plate 31.

FIG. 4(a) is a front view illustrating the partition plate 31. FIG. 4(b) is a side view illustrating the partition plate 31. The partition plate 31 is provided with an opening 36 at a portion (central portion) excluding the edges.

Figure 5:
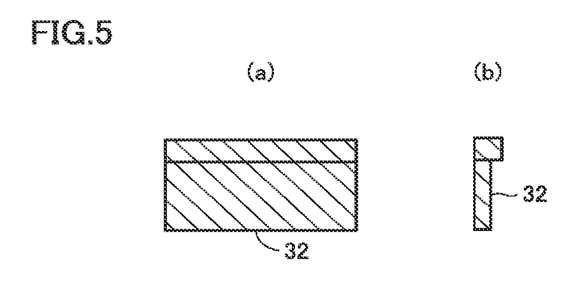
FIG. 5(a) is a front view illustrating an air volume adjustment plate 32.
FIG. 5(b) is a side view illustrating the air volume adjustment plate 32.

FIG. 5(a) is a front view illustrating the air volume adjustment plate 32. FIG. 5(b) is a side view illustrating the air volume adjustment plate 32. The air volume adjustment plate 32 is configured to be movable in the vertical direction.

Figure 6:
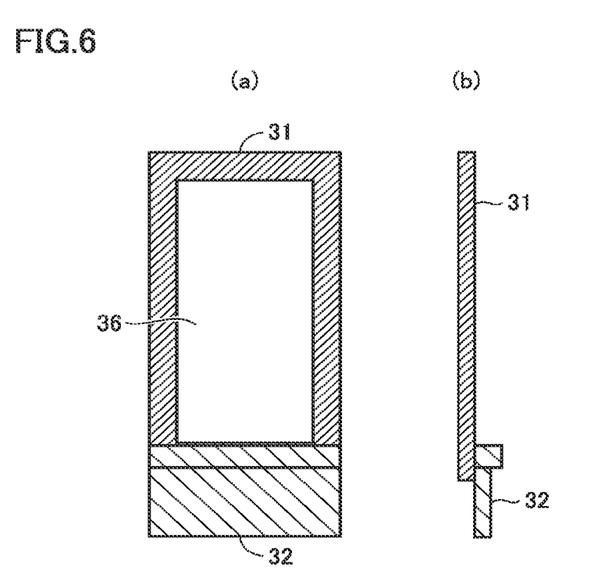
FIG. 6(a) is a front view illustrating the position of the air volume adjustment plate 32 with respect to the partition plate 31 when the installation specification is the first installation specification or the second installation specification according to the first embodiment.
FIG. 6(b) is a side view illustrating the position of the air volume adjustment plate 32 with respect to the partition plate 31 when the installation specification is the first installation specification or the second installation specification according to the first embodiment.

FIG. 6(a) is a front view illustrating the position of the air volume adjustment plate 32 with respect to the partition plate 31 when the installation specification is the first installation specification or the second installation specification according to the first embodiment. FIG. 6(b) is a side view illustrating the position of the air volume adjustment plate 32 with respect to the partition plate 31 in which the installation specification is the first installation specification or the second installation specification according to the first embodiment.

The air volume adjustment plate 32 is movable in the vertical direction, and when the installation specification is the first installation specification or the second installation specification, the air volume adjustment plate 32 is disposed at the lowermost position, which makes the opening 36 formed on the partition plate 31 fully open.

After air sucked from the air inlet 91c flows through the second block 42, the air flows through the partition structure 30 into the space 134 and is exhausted from the air outlet 92.

Figure 7:
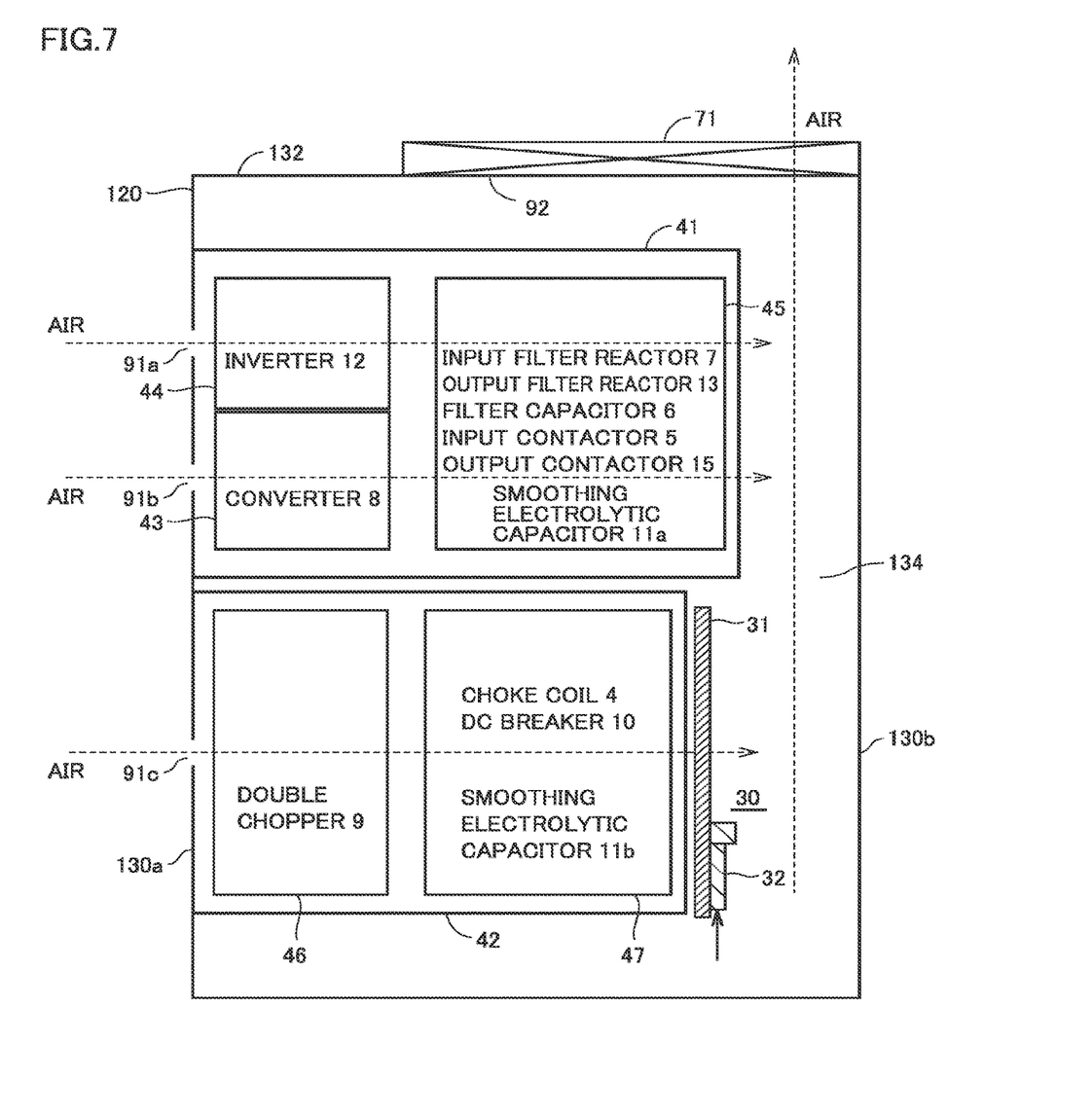
FIG. 7 is a cross-sectional view illustrating components arranged in the housing when the installation specification is the third installation specification.

FIG. 7 is a cross-sectional view illustrating components arranged in the housing when the installation specification is the third installation specification.

Figure 8:
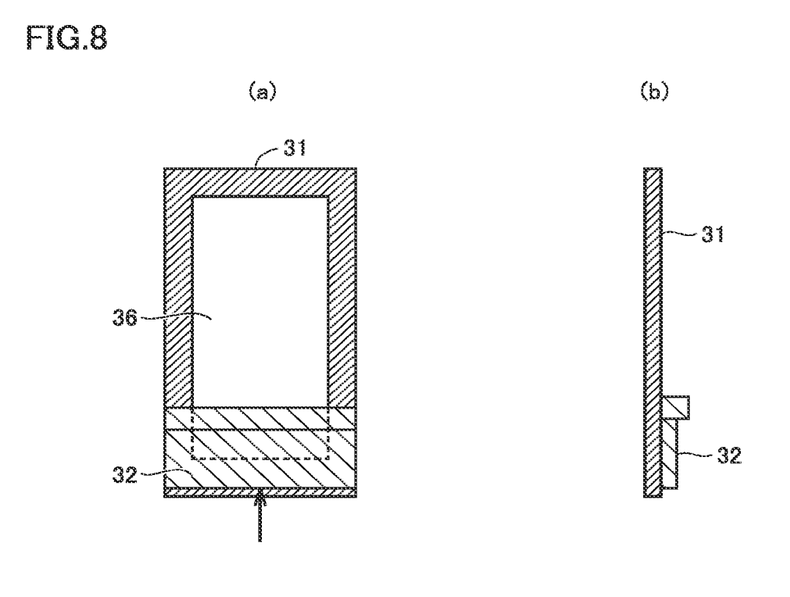
FIG. 8(a) is a front view illustrating the position of the air volume adjustment plate 32 with respect to the partition plate 31 when the installation specification is the third installation specification according to the first embodiment.
FIG. 8(b) is a side view illustrating the position of the air volume adjustment plate 32 with respect to the partition plate 31 when the installation specification is the third installation specification according to the first embodiment.

FIG. 8(a) is a front view illustrating the position of the air volume adjustment plate 32 with respect to the partition plate 31 when the installation specification is the third installation specification according to the first embodiment. FIG. 8(b) is a side view illustrating the position of the air volume adjustment plate 32 with respect to the partition plate 31 when the installation specification is the third installation specification according to the first embodiment.

When the installation specification is the third installation specification, the air volume adjustment plate 32 is disposed at a position moved upward from the lowermost position. Thus, a part of the opening 36 on the partition plate 31 is covered by the air volume adjustment plate 32. When the installation specification is the third installation specification, the degree to which the opening 36 formed on the partition plate 31 is covered can be determined by experiment or simulation before shipment.

After the air sucked from the air inlet 91c flows through the second block 42, the partition structure 30 blocks the air from flowing into the space 134, and thereby, the air flows toward the first block 41. When the installation specification is the third installation specification, the AC current flowing through the first block 41 is larger than that in the first or second installation specification, and thereby the amount of heat generated by the first block 41 becomes larger. Since additional air flows from the second block 42 into the first block 41, the cooling capability of the first block 41 is improved, which makes it possible to deal with the increased heat generation. In the third installation specification, since the current flowing through the second block 42 is smaller than the current flowing through the second block 42 in the first or second installation specification, the amount of heat generated by the second block 42 is smaller, and thereby, it is possible to reduce the air flowing through the second block 42 without causing any problem.

In other words, in the third installation specification, by reducing the air flow to the second block 42 so as to relatively increase the air flow to the first block 41, it is possible to increase the current flowing through the components in the first block 41, which makes it possible to increase the rated capacity of the components.

As described above, according to the present embodiment, in an uninterruptible power supply system of a forced air cooling type, it is possible to optimize the cooling by finely adjusting the opening or closing state of the partition plate to adjust the air flow so as to meet wider installation specifications without changing the arrangement of components inside the housing. Although the air volume adjustment plate 32 is illustrated to cover only a part of the opening 36 formed on the partition plate 31, the air volume adjustment plate 32 may cover not only a part of the opening 36 formed on the partition plate 31 but also the entire opening 36.

Second Embodiment

Figure 9:
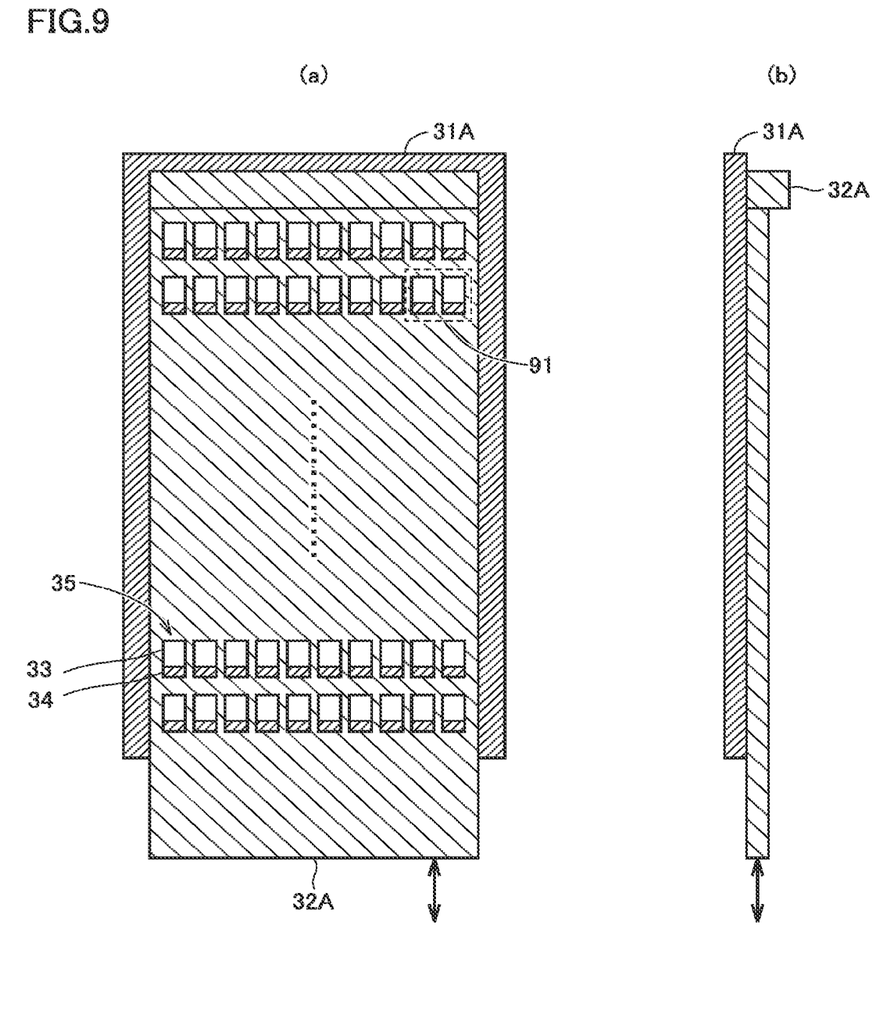
FIG. 9(a) is a front view illustrating a partition plate 31A and an air volume adjustment plate 32A overlapped with each other according to a second embodiment.
FIG. 9(b) is a side view illustrating the partition plate 31A and the air volume adjustment plate 32A overlapped with each other according to the second embodiment.

In the second embodiment, the partition structure 30 also includes a partition plate 31A and an air volume adjustment plate 32A.

The partition structure 30 of the second embodiment is disposed at a position similar to that of the first embodiment.

Figure 10:
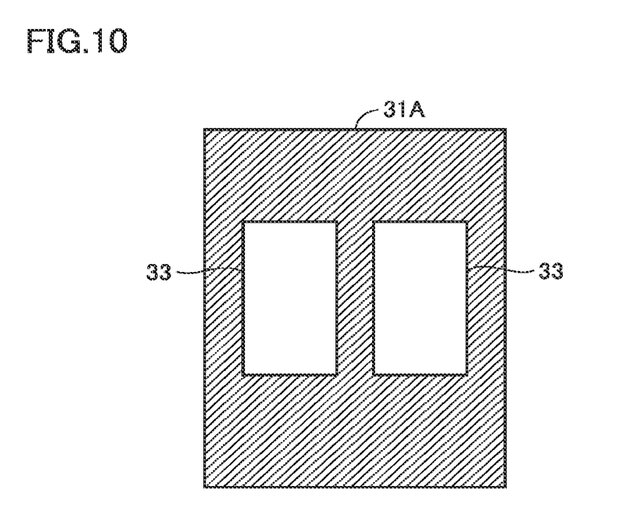
FIG. 10 is an enlarged front view illustrating a part of the partition plate 31A.
Figure 11:
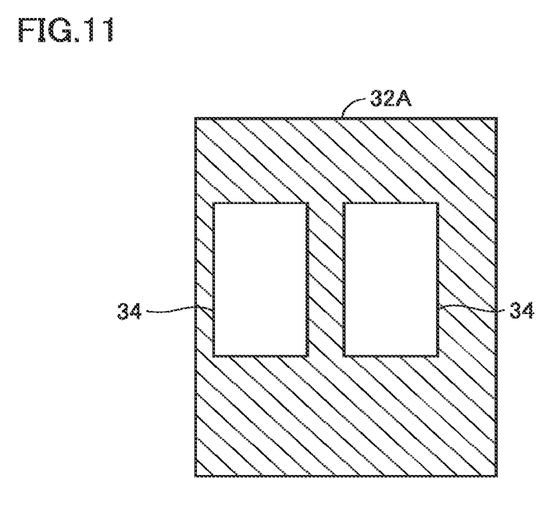
FIG. 11 is an enlarged front view illustrating a part of the air volume adjustment plate 32A.
Figure 12:
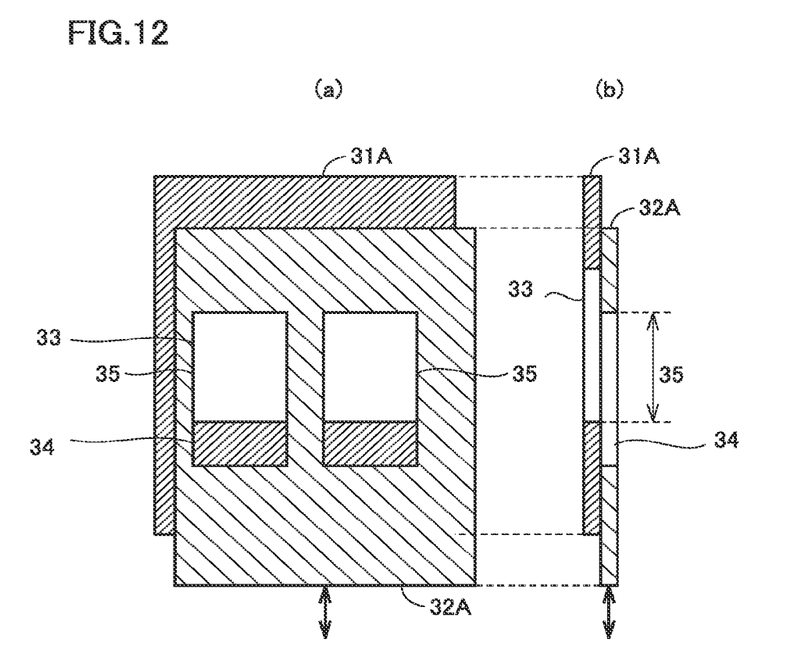
FIG. 12(a) is an enlarged front view illustrating a part of the partition plate 31A and the air volume adjustment plate 32A overlapped with each other according to the second embodiment.
FIG. 12(b) is an enlarged side view illustrating a part of the partition plate 31A and the air volume adjustment plate 32A overlapped with each other according to the second embodiment.

FIG. 9(a) is a front view illustrating the partition plate 31A and the air volume adjustment plate 32A overlapped with each other according to the second embodiment. FIG. 9(b) is a side view illustrating the partition plate 31A and the air volume adjustment plate 32A overlapped with each other according to the second embodiment. FIG. 10 is an enlarged front view illustrating a part of the partition plate 31A. FIG. 11 is an enlarged front view illustrating a part of the air volume adjustment plate 32A. FIG. 12(a) is an enlarged front view illustrating a part of the partition plate 31A and the air volume adjustment plate 32A overlapped with each other according to the second embodiment. FIG. 12(b) is an enlarged side view illustrating a part of the partition plate 31A and the air volume adjustment plate 32A overlapped with each other according to the second embodiment.

The partition plate 31A is formed with a plurality of openings 33. The plurality of openings 33 have the same size and are formed in a lattice pattern. The air volume adjustment plate 32A is formed with a plurality of openings 34. The plurality of openings 34 have the same size and are formed in a lattice pattern.

The number of the plurality of openings 33 is equal to the number of the plurality of openings 34. The size of each opening 33 is equal to the size of each opening 34.

The partition plate 31A is fixed at the same position as in the first embodiment. The air volume adjustment plate 32A can be moved in the vertical direction so that a part or all of each opening 33 formed on the partition plate 31 overlaps with a part or all of a corresponding opening 34 formed on the air volume adjustment plate 32A. Thereby, it is possible to change the size of an overlapping portion 35 between the opening 33 and the opening 34, which makes it possible to control the air flow.

When the installation specification is the first installation specification or the second installation specification, the air volume adjustment plate 32A is disposed at the lowermost position, the opening 33 and the opening 34 completely overlap each other, and thereby, the size of the overlapping portion 35 becomes the maximum. Thus, after the air sucked from the air inlet 91c flows through the second block 42, most of the air flows through the partition structure 30 into the space 134 and is exhausted from the air outlet 92.

When the installation specification is the third installation specification, the air volume adjustment plate 32 is disposed at a position moved upward from the lowermost position. Thereby, a part of the opening 33 of the partition plate 31A and a part of the opening 34 of the air volume adjustment plate 32A overlap with each other, and thereby, the size of the overlapping portion 35 becomes smaller than that in the first installation specification or the second installation specification. When the installation specification is the third installation specification, the degree to which the opening 33 of the partition plate 31A is covered can be determined by experiment or simulation before shipment.

Thus, after the air sucked from the air inlet 91c flows through the second block 42, the partition structure 30 blocks the air from flowing into the space 134, which thereby increases the amount of the air flow to the first block 41. Thus, similar to the first embodiment, according to the second embodiment, in the third installation specification, by reducing the air flow to the second block 42 so as to relatively increase the air flow to the first block 41, it is possible to increase the current flowing through the components in the first block 41, which makes it possible to increase the rated capacity of the components. Although the air volume adjustment plate 32A is illustrated to cover only a part of the opening 33 formed on the partition plate 31A, it may cover not only a part of the opening 33 formed on the partition plate 31A but also the entire opening 33.

Although the air flowing through the second block 42 may become unbalanced in the vertical direction in the first embodiment, the second embodiment has an advantage that such unbalance does not occur.

Modification

All components (the inverter 12, the converter 8, the input filter reactor 7, the output filter reactor 13, the filter capacitor 6, the input contactor 5, and the output contactor 15) through which an AC current flows may not be disposed in the first block 41. Only a group of components through which an AC current flows may be disposed in the first block 41, or a group of components through which an AC current flows and a group of components through which a DC current flows may be disposed in the first block 41. The group of components through which an AC current flows may include, for example, the inverter 12 and the converter 8 which generate a large amount of heat.

All components (the DC breaker 10, the choke coil 4, the double chopper 9, the smoothing electrolytic capacitor 11) through which a DC current flows may not be disposed in the second block 42. Only a group of components through which a DC current flows may be disposed in the second block 42, or a group of components through which a DC current flows and a group of components through which an AC current flows may be disposed in the second block 42. The group of components through which a DC current flows may include, for example, the double chopper 9 which generates a large amount of heat.

It should be understood that the embodiments disclosed herein are illustrative and not restrictive in all respects. The scope of the present disclosure is defined by the terms of the claims, rather than the description above, and is intended to include any modifications within the meaning and scope equivalent to the terms of the claims.

REFERENCE SIGNS LIST

1: uninterruptible power supply system; 2: commercial AC power supply; 4: choke coil; 5: input contactor; 6: input filter capacitor; 7: input filter reactor; 8: converter; 8a, 12a: AC terminal; 9: double chopper; 10: DC breaker; 11: smoothing electrolytic capacitor; 12: inverter; 13: output filter reactor; 14: output filter capacitor; 15: output contactor; 30: partition structure; 31, 31A: partition plate; 32, 32A: air volume adjustment plate; 33, 34, 36: opening; 41: first block; 42: second block; 51: battery; 52: load; 71: cooling fan; 91a, 91b, 91c: air inlet; 92: air outlet; 120: housing; 130a: first side surface; 130b: second side surface; 132: top surface; 134: space; L1: DC line; NP: neutral point; T1: AC input terminal; T2: battery terminal; T3: AC output terminal

The invention claimed is:

1. An uninterruptible power supply system comprising:
a housing that houses components of the uninterruptible power supply system;
a cooling fan that cools the interior of the housing;
a group of electrical components that constitute the uninterruptible power supply system and are disposed in a first block of the housing;
the other group of electrical components that constitute the uninterruptible power supply system and are disposed in a second block of the housing; and
a partition structure that is disposed adjacent to an exhaust side of the second block to adjust an air flow flowing through the first block and the second block,
the group of electrical components including an electrical component through which an AC current flows, and
the other group of electrical components including an electrical component through which a DC current flows.

2. The uninterruptible power supply system according to claim 1, wherein
the first block includes at least one of a converter that converts first AC power from a commercial AC power source into DC power, and an inverter that converts the DC power generated by the converter or DC power supplied from a power storage device into second AC power and supplies the second AC power to a load,
the second block includes at least a double chopper that stores the DC power generated by the converter in a battery when the commercial AC power supply is in service, and supplies the DC power from the battery to the inverter when the commercial AC power supply is out of service.

3. The uninterruptible power supply system according to claim 1, wherein
the partition structure is configured to increase the air flow flowing through the first block and decrease the air flow flowing through the second block in an installation specification in which the magnitude of the AC current is larger than a first magnitude and the magnitude of the DC current is smaller than a second magnitude as compared with an installation specification in which the magnitude of the AC current is equal to the first magnitude and the magnitude of the DC current is equal to the second magnitude.

4. The uninterruptible power supply system according to claim 1, wherein an air inlet is disposed on a first side surface of the housing, the cooling fan and an air outlet are disposed on an upper surface of the housing, the first block is disposed adjacent to the first side surface at a higher position, and the second block is disposed adjacent to the first side surface at a lower position, a space is formed between a second side surface opposed to the first side surface of the housing and the first block and the second block, the partition structure is disposed opposite to the second side surface and adjacent to the second block, and the partition structure is formed with an opening having an adjustable aperture.

5. The uninterruptible power supply system according to claim 4, wherein the partition structure includes a partition plate and an air volume adjustment plate, the opening is formed on the partition plate, and the air volume adjustment plate is movable in the vertical direction so as to cover a part or all of the opening formed on the partition plate.

6. The uninterruptible power supply system according to claim 4, wherein the partition structure includes a partition plate and an air volume adjustment plate, each of the partition plate and the air volume adjustment plate is formed with a plurality of openings, and the air volume adjustment plate is movable in the vertical direction so as to cover a part or all of each opening formed on the partition plate.

7. The uninterruptible power supply system according to claim 6, wherein the plurality of openings formed on the partition plate have the same size and are formed in a lattice pattern, the plurality of openings formed on the air volume adjustment plate have the same size and are formed in a lattice pattern.

8. The uninterruptible power supply system according to claim 7, wherein the number of the plurality of openings formed on the partition plate is equal to the number of the plurality of openings formed on the air volume adjustment plate, the size of each opening formed on the partition plate is equal to the size of each opening formed on the air volume adjustment plate, and the air volume adjustment plate is movable in such a manner that a part or all of each opening formed on the partition plate overlaps with a part or all of a corresponding opening formed on the air volume adjustment plate.

* * * * *